United States Patent
Irvine et al.

(10) Patent No.: US 9,469,906 B2
(45) Date of Patent: Oct. 18, 2016

(54) METHOD FOR EFFECTING A PHOTOCATALYTIC OR PHOTOELECTROCATALYTIC REACTION

(71) Applicant: University Court of the University of St Andrews, St. Andrews (GB)

(72) Inventors: John Thomas Sirr Irvine, St. Andrews (GB); Xiaoxiang Xu, St. Andrews (GB); Chamnan Randorn, St. Andrews (GB)

(73) Assignee: UNIVERSITY COURT OF THE UNIVERSITY OF ST ANDREWS, St Andrews (GB)

( * ) Notice: Subject to any disclaimer, the term of this patent is extended or adjusted under 35 U.S.C. 154(b) by 0 days.

(21) Appl. No.: 14/261,553

(22) Filed: Apr. 25, 2014

(65) Prior Publication Data

US 2014/0231241 A1 Aug. 21, 2014

Related U.S. Application Data

(63) Continuation of application No. PCT/GB2012/052659, filed on Oct. 25, 2012.

(30) Foreign Application Priority Data

Oct. 25, 2011 (GB) .................................. 1118429.8

(51) Int. Cl.
*C25B 1/04* (2006.01)
*B01J 23/20* (2006.01)
(Continued)

(52) U.S. Cl.
CPC ................ *C25B 1/003* (2013.01); *B01J 23/20* (2013.01); *B01J 35/004* (2013.01);
(Continued)

(58) Field of Classification Search
CPC ... C25B 1/003; B01J 35/004; B01J 35/0033; B01J 23/20; H01L 31/0264; C02F 1/30; C02F 1/725; C02F 2101/308; C02F 2305/10; C02F 2101/363; H01M 14/005; C01B 3/042
USPC ............ 205/340; 204/157.5, 157.15, 157.52; 136/252, 260, 263
See application file for complete search history.

(56) References Cited

U.S. PATENT DOCUMENTS 4,419,278 A * 12/1983 Gordon .................... C25B 1/003 429/111
4,521,499 A * 6/1985 Switzer .................... C25B 1/003 429/111

(Continued)

FOREIGN PATENT DOCUMENTS

| CN | 101234347 A | 8/2008 |
|---|---|---|
| WO | 2007022462 A2 | 2/2007 |

OTHER PUBLICATIONS

Kato et al, "Role of Ag+ in the Band Structures and Photocatalytic Properties of AgMO3 (M: Ta and Nb) with the Perovskite Structure," J. Phys. Chem. B 2002, vol. 106, pp. 12441-12447.*

(Continued)

*Primary Examiner* — Keith Hendricks
*Assistant Examiner* — Colleen M Raphael
(74) *Attorney, Agent, or Firm* — Hahn Loeser & Parks LLP (57) ABSTRACT

The invention provides a method for effecting a photocatalytic or photoelectrocatalytic reaction of a reactant comprising contacting a metallic material having an electrical conductivity of $10^5$ to $10^6$ S/m with the reactant and exposing the metallic material and the reactant to visible light so as to catalyze the reaction of the reactant.

16 Claims, 3 Drawing Sheets

(51) Int. Cl.
| | |
|---|---|
| B01J 35/00 | (2006.01) |
| C01B 3/04 | (2006.01) |
| H01L 31/0264 | (2006.01) |
| H01M 14/00 | (2006.01) |
| C25B 1/00 | (2006.01) |
| C02F 1/30 | (2006.01) |
| C02F 1/72 | (2006.01) |
| C02F 101/30 | (2006.01) |
| C02F 101/36 | (2006.01) |

(52) U.S. Cl.
CPC ........... *B01J 35/0033* (2013.01); *C01B 3/042* (2013.01); *C02F 1/30* (2013.01); *C02F 1/725* (2013.01); *H01L 31/0264* (2013.01); *H01M 14/005* (2013.01); *C02F 2101/308* (2013.01); *C02F 2101/363* (2013.01); *C02F 2305/10* (2013.01); *Y02E 60/364* (2013.01); *Y02P 20/135* (2015.11); *Y02W 10/37* (2015.05)

(56) References Cited

U.S. PATENT DOCUMENTS

| | | | | |
|---|---|---|---|---|
| 2004/0089540 | A1* | 5/2004 | Van Heuveln | C01G 51/68 204/242 |
| 2004/0211461 | A1* | 10/2004 | Murai | H01G 9/2009 136/263 |
| 2006/0029536 | A1 | 2/2006 | Kim et al. | |
| 2007/0039814 | A1* | 2/2007 | Maggard | C01B 3/042 204/157.15 |
| 2007/0122101 | A1* | 5/2007 | Buretea | C03C 14/006 136/263 |
| 2015/0243444 | A1* | 8/2015 | Irwin | H01G 9/2027 136/263 |

OTHER PUBLICATIONS

Lecomte et al, "Non-stoichiometry and electrical conductivity of strontium niobates with perovskite structure II. Ionic conductivity of Sr(Sr(1/3)+xNb(2/3)-x)O3-(3/2)x," Physica Status Solidi A: Applied Research vol. 66 Issue 2 pp. 551-558.*

Saito et al, "Lithium niobate nanowires for photocatalytic water splitting," Dalton Trans., 2011, 40, p. 3909-3913.*

Dictionary.com, Dictionary.com Unabridged. Retrieved Sep. 22, 2015, from Dictionary.com website: http://dictionary.reference.com/browse/metallic.*

Kim et al, "Highly donor-doped (110) layered perovskite materials as novel photocatalysts for overall water splitting," Chem. Commun., 1999, pp. 1077-1078.*

Kudo et al, "Water Splitting into H2 and O2 on New Sr2M2O7 (M ) Nb and Ta) Photocatalysts with Layered Perovskite Structures: Factors Affecting the Photocatalytic Activity," J. Phys. Chem. B 2000, vol. 104, pp. 571-575.*

B. Hessen et al, Crystallization of Reduced Strontium and Barium Niobate Perovskites from Borate Fluxes, Mat. Res. Bull., vol. 26, pp. 85-90, 1991. Printed in USA.

K. Isawa et al, Synthesis and Transport Properties of SrxNbO3 ($0.75 \leq x \geq 0.90$), Physical Review B, vol. 47, No. 5, pp. 2849-2853, Feb. 1, 1993.

N. Peng et al, Synthesis and Crystal Structure of the Distorted Perovskite Sr0.97NbO3 Determined by High Resolution Powder Neutron Diffraction, J. Mater Chem., 8(4), pp. 1033-1038, 1998.

D. Ridgley et al, The Preparation of a Strontium-Niobium Bronze with Perovskite Structure, J. Am. Chem. Soc, vol. 77, pp. 6132-6136, Apr. 27, 1955.

P.G. Dickens et al, The Tungsten Bronzes and Related Compounds, pp. 30-44, Published on Jan. 1, 1968 on http://pubs.rsc.org | doi:10.1039/QR9862200030.

A. Fujishima et al, Electrochemical Photolysis of Water at a Semiconductor Electrode, Nature, Nature Publishing Group, vol. 238, pp. 37-38, Jul. 7, 1972.

E. Konysheva et al, Evolution of Conductivity, Structure and Thermochemical Stability of Lanthanum Manganese Iron Nickelate Perovskites, Journal of Materials Chemistry, 2008, 18, pp. 5147-5154.

A. Kudo et al, Heterogeneous Photocatalyst Materials for Water Splitting, Chemical Society Review, 2009, 38, pp. 253-278.

A. Kudo, Photocatalyst Materials for Water Splitting, Cataysis Surveys from Asia, vol. 7, No. 1, pp. 31-38, Apr. 2003.

A. Kudo, Z-scheme Photocatalyst Systems for Water Splitting Under Visible Light Irradiation, MRS Bulletin, vol. 36, pp. 32-38, Jan. 2011.

K. Sayama et al, A New Photocatalytic Water Splitting System Under Visible Light Irradiation Mimicking a Z-scheme Mechanism in Photosynthesis, Journal of Photochemistry and Photobiology A: Chemistry, vol. 148, pp. 71-77, 2002.

I.R. Shein et al, First-principles Calculations of the Elastic and Electronic Properties of the Cubic Perovskites SrMO3 (M=Ti, V, Zr and Nb) in Comparison with SrSnO3, Science Direct, Solid State Sciences, Elsevier Masson SAS, vol. 10, pp. 217-225, 2008.

H. Iwakura et al, Relationship Between Cation Arrangement and Photocatalytic Activity for Sr—Al—Nb—O Double Perovskite, Inorganic Chemistry, vol. 49, No. 24, pp. 11362-11369, Dec. 20, 2010.

In-Sun Cho et al, Effects of Crystal and Electronic Structures of ANb2O6 (A=Ca, Sr, Ba) Metaniobate Compounds on Their Photocatalytic H2 Evolution From Pure Water, Science Direct, International Journal of Hydrogen Energy, Elsevier Ltd., vol. 35, No. 23, pp. 12954-12960, Dec. 1, 2010.

In-Sun Cho et al, SrNb2O6 Nanotubes with Enhanced Photocatalytic Activity, Journal of Materials Chemistry, vol. 20, No. 19, pp. 3979-3983, Jan. 1, 2010.

S. Ikeda et al, Effect of the Particle Size for Photocatalytic Decomposition of Water on Ni-loaded K4Nb6O17, Microporous Materials, Elsevier Science B.V., vol. 9, No. 5-6, pp. 253-258, May 1, 1997.

Tong-Guang Xu et al, Monomolecular-Layer Ba5Ta4O15 Nanosheets: Synthesis and Investigation of Photocatalytic Properties, Advanced Functional Materials, vol. 16, No. 12, pp. 1599-1607, Aug. 4, 2006.

H. Kato et al, Photocatalytic Reduction of Nitrate Ions Over Tantalate Photocatalysts, Physical Chemistry Chemical Physics, vol. 4, No. 12, pp. 2833-2838, Jun. 15, 2002.

Search Report and Written Opinion for application PCT/GB2012/052659, dated Oct. 25, 2012.

Search Report for application GB1118429.8 dated Feb. 21, 2012.

* cited by examiner

METHOD FOR EFFECTING A PHOTOCATALYTIC OR PHOTOELECTROCATALYTIC REACTION

CROSS-REFERENCE TO RELATED APPLICATIONS

This application claims priority to, fully incorporates by reference, and is a continuation of International Application No. PCT/GB2012/052659, published as WO 2013/061069 filed on 25 Oct. 2012, which claims priority to provisional application GB 1118429.8 filed on 25 Oct. 2011.

TECHNICAL FIELD

The present invention relates to the use of metallic material as a photoactive material, photovoltaic devices comprising metallic material and methods of effecting photocatalytic reactions involving use of metallic material as the photoactive material.

BACKGROUND OF THE INVENTION

Photocatalytic reactions are reactions in which the energy input is provided, at least in part, by light and which are accelerated by a catalyst. Photocatalytic reactions are generally understood to comprise a sequence of processes initiated by absorption of a photon by the photocatalyst. This causes promotion of electrons from the catalyst's valence band to the conduction band, creating electron-hole pairs. These cause the catalysis through redox reactions.

The archetypal photocatalytic reaction is the catalysed photolysis of water, which was first reported in 1972 using a titanium dioxide photoelectrode (A Fujishima and K Honda, *Nature*, 1972, 238, 37-38).

Since at least the report of the photocatalytic hydrolysis of water by Fujishima and Honda, it has been understood that photocatalytic reaction is require the use of semiconductors, such as titanium dioxide, having proper band gaps and band edges, that is to say non-overlapping valence and conduction bands. Accordingly, photon energies must be greater than the band gap in order to generate the desired electron-hole pairs. Innumerable semiconductors have been evaluated for utility as photocatalysts.

Light absorption across the bandgap in semiconductors is exploited in many important applications such as photovoltaics, light-emitting diodes and photocatalytic conversion. Metals differ from semiconductors in that there is no bandgap separating occupied and unoccupied levels with a continuum of energy levels across the conduction band. For this reason, whilst the creation of electron-hole pairs will occur upon absorption of photons by metals, the overlapping nature of the valence and conductance bands lead to recombination. This prevents the harnessing of the electron-hole pairs in photocatalytic reactions.

It is nevertheless possible to excite electrons from states in a fully occupied valence band into unoccupied levels higher than the conduction band edge, a phenomenon evidenced by strongly coloured metallic materials. However, the utility of such electron-hole pairs in light-harvesting or similar applications has been assumed to require separation of the created carriers in the conductor using an electric field. Such a field is typically found at an interface in a semiconductor, such as a p-n junction in photovoltaics or at its surface in photocatalysis. However, the high conductivity of a metal would preclude sufficient electric field being available to separate photocarriers, meaning catalytic photocatalytic activity is not a property metals are anticipated to possess.

For the foregoing reasons, semiconductors are universally utilised in photochemical/photovoltaic applications. However, the use of materials with defined band gaps generally leads to poor light absorption and thus low efficiencies in photocatalytic reactions and other photovoltaic applications. Moreover, conductive glasses such as tin oxide are generally used in photoelectrochemistry as a substrate material for semiconductors. However, this approach is disadvantageous, inevitably increasing expense and/or complexity.

SUMMARY

Materials can only be strongly coloured if they strongly absorb light, which must create electron-hole pairs. Whilst the high conductivities of metals are generally understood to preclude sufficient electric field being available to separate photocarriers, such that photocatalytic activity of metals would not be anticipated, we have found that the high carrier mobility in a material having metal-like properties can facilitate kinetic charge separation without the need for an electric field. We have surprisingly found, therefore, that the current consideration of photoactivity in materials solely in terms of semiconductor excitations is an incomplete description. More particularly, we have found that kinetic charge separation is possible, and may be harnessed in photocatalytic reactions, by using suitable metallic materials. Notably, there is no need for an electric field to be present in order to use appropriate metallic materials in this way. By extending the possibilities of materials suitable for use as photocatalysts to include materials with metallic properties, not only does the present invention expand the possibilities for photoactive materials: it also opens up the possibility to develop radical new approaches to light harvesting.

Viewed from a first aspect, therefore, the invention provides a method for effecting a photocatalytic or photoelectrocatalytic reaction of a reactant comprising contacting a metallic material having an electrical conductivity of $10^5$ to $10^6$ S/m with the reactant and exposing the metallic material and the reactant to visible light so as to catalyse the reaction of the reactant.

Viewed from a second aspect, the invention provides the use of a metallic material having an electrical conductivity of $10^5$ to $10^6$ S/m as a photoactive material, e.g. as a photocatalyst or as a photoelectrocatalyst.

Viewed from a third aspect, the invention provides a photovoltaic device comprising photoactive material in which the photoactive material is a metallic material having an electrical conductivity of $10^5$ to $10^6$ S/m.

Further aspects and embodiments of the present invention will be evident from the discussion that follows below.

BRIEF DESCRIPTION OF THE FIGURES

FIG. 2(b) showing typical time courses of $O_2$ evolution in aqueous silver nitrate solution (0.005 M).

FIG. 3 shows, schematically, possible photocatalytic-type processes to drive solar redox processes.

DETAILED DESCRIPTION

The present invention arises from the recognition that that the current consideration of materials' photoactivity solely in terms of semiconductor excitations is an incomplete description. In particular, it is possible to use metallic materials as photoactive material in a variety of applications, without the need for application of an electric field; instead, kinetic charge separation allows exploitation of the photovoltaic effect. This permits a diverse range of materials, previously thought unsuitable, to be used as photoactive materials.

By photoactive material is meant herein the material within a photovoltaic device that absorbs photons that have energy at least equal to that required to create electron-hole pairs. Photoactive material is found in all photovoltaic devices and equipment reliant upon the photovoltaic effect, and which make use of the photovoltaic effect when converting the energy of incident photons into electrical energy. For example, photoactive material is found in photovoltaic cells (also known as solar cells, where the incident light is sunlight), devices that convert the energy of light directly into electricity through the photovoltaic effect; and photocatalysts or photoelectrocatalysts. For example, photoactive material is found in the photoanodes of photoelectrochemical cells.

The subsequent discussion focuses on the application of the present invention to the field of photocatalysis by way of example; however, this is intended to be illustrative, rather than limiting of, the invention.

According to particular embodiments of the invention, the metallic material defined according to the various embodiments of this invention is coloured, meaning that it is absorbing visible electromagnetic radiation.

According to particular embodiments of the invention, the metallic material defined according to the various embodiments of this invention comprises non-stoichiometric perovskite having the formula (I):

$$A_{1-x}BO_{3-\delta} \quad (I),$$

wherein:
  $0 \leq x < 0.25$;
  A is at least one of Sr, Ba, Ca and Cd;
  B is at least one of Nb, V, Ta, Ti, Cr, Mo and W; and
  δ is zero or a positive number of less than 1,
  wherein $x > 0$ and $\delta \neq 0$ where A is Sr and B is Nb.

According to other particular embodiments, the metallic material defined according to the various aspects of this invention comprises a tungsten bronze or related compound, which may or may not be of formula (I). Such compounds are a well understood class of compound having metallic appearance, the first of which—sodium tungsten bronze—was discovered in 1824. Tungsten bronzes themselves are arguably the most well-documented of these compounds, being well-defined non-stoichiometric compounds of the general formula $Y_yWO_3$, wherein Y is a metal or hydrogen ion, wherein, as described by P G Dickens and M S Whittingham (Q. Rev. Chem. Soc., 1968, 22, 30-44) the metal ion is typically selected from the group consisting of lithium, sodium, potassium, rubidium, caesium, calcium, strontium, barium, lanthanum, aluminium, copper, zinc, gallium, silver, cadmium, indium, thallium, lead, cerium, praesdymium, neodymium, europium, gadolinium, terbium, dysprosium, holmium, erbium, thulium, ytterbium and luttetium; and $0 < y \leq 1$.

As is discussed by Dickens and Whittingham, and in the references cited therein, compounds (bronzes) analogous to tungsten bronzes, in which the tungsten ions are replaced with molybdenum, vanadium, niobium and titanium, have also been described. Accordingly, where the metallic material that may be used according to the various aspects of the invention is a tungsten bronze or related compound, this may be defined generally by formula (II):

$$Y_yZO_3 \quad (II)$$

wherein:
  $0 < y \leq 1$;
  Y is at least one of H, Li, Na, K, Rb, Cs, Ca, Sr, Ba, La, Al, Cu, Zn, Ga, Ag, Cd, In, Tl, Pb, Ce, Pr, Nd, Eu, Gd, Tb, Dy, Ho, Er, Tm, Yb and Lu including combinations thereof; and
  Z is at least one of W, Mo, V, Ni and Ti including combinations thereof.

Bronzes of formula (II) are well-documented compounds and, in addition to the description by Dickens and Whittingham (infra) and P Hagenmuller ("*Tungsten bronzes, vanadium bronzes, and related compounds*", Ch. 50 in *Comprehensive Inorganic Chemistry*, 1973, 4, 541-605, Pergamon Press, Oxford), are also described in standard inorganic chemistry textbooks such as *Advanced Inorganic Chemistry* by F A Cotton and G Wilkinson ($6^{th}$ Ed.) and *Chemistry of the Elements* by N N Greenwood and A Earnshaw ($2^{nd}$ Ed). The skilled person is thus acquainted with both the preparation as well as their structural features.

In compounds of formula (II): Y is typically Li, Na, K, Rb, Cs, Ca, Sr or Ba, in particular Sr; and/or Z is typically Nb, W or Mo, in particular Nb. According to these and other embodiments, y is typically such that $0.3 \leq y \leq 0.95$, in particular such that $0.3 < y \leq 0.95$.

In the following discussion, emphasis is placed upon metallic material of formula (I). However, it is to be understood that this is illustrative rather than limiting in relation to the present invention.

Typically, all perovskites of formula (I), i.e in addition to those in which A is Sr and B is Nb, are non-stoichiometric and have $0 < x < 0.25$.

These materials have different colours, ranging from blue to red, depending on the charge of transition metal cations (in consequence of the stoichiometry or non-stoichiometry defined by the value of x). As is known, the value of δ in formula (I), where x is >0, will be a positive number of less than 1 that is dependent upon the value of x and need not be separately defined. For this reason, non-stoichiometric perovskites, such as those of formula (I) where x>0 are sometimes represented in step by the formula $A_{1-x}BO_3$ in which the presence of fewer than three molar equivalents of oxygen in $A_{1-x}BO_{3-\delta}$ is understood as being implied.

Stoichiometric perovskite strontium niobate ($SrNbO_3$), a stoichiometric perovskite corresponding to formula (I) but in which x (and δ) is 0, would be an archetypal $d^1$ oxide and might be expected to exhibit interesting electronic properties such as metallicity. Band structure calculations on this composition indicate metallic conductivity with the Fermi-level in the middle of the conduction band. However, direct and indirect band gaps of 2.79 and 2.38 eV respectively are predicted from calculations of the elastic and electronic properties of cubic perovskites of formula $SrMO_3$ (in which M=Ti, V, Zr and Nb) in comparison with $SrSnO_3$ (see I R Shein et al., *Solid State Sci.*, 2008, 10, 217-225). The stoichiometric $SrNbO_3$ phase with cubic perovskite structure has proven difficult to realise (see N Peng et al. (*J. Mater Chem*, 1998, 8, 1033-1038), possibly indicative of a charge disproportionation phenomenon; however, non-stoichiometric cubic perovskites of formula (I) are readily made.

According to some embodiments, A may be of a single element. In other embodiments, A may be of more than one element, e.g. two elements. An example of this is the metallic material $Ba_{0.1}Sr_{0.8}NbO_{3-\delta}$. It will be understood that, where A is of more than one element, the proportions of the different constituents of A may vary within 1−x. Generally, although not necessarily, B is of one element, e.g. is Nb or V.

According to particular embodiments of the invention in which the metallic material is of formula (I), A is strontium and/or barium, e.g. is strontium. According to other embodiments of the invention in which the metallic material is of formula (I), B is one or more of Nb, V, Ti, Cr, Mo and W, e.g. niobium. According to particular embodiments, A is strontium and B is niobium. According to each of these three embodiments, and of other embodiments of the invention in which the metallic material is of formula (I), $0.1 \leq x \leq 0.2$.

The series $Sr_{1-x}NbO_{3-\delta}$ yields cubic perovskites for $0.1 < x < 0.25$, as reported previously (see, for example D Ridgley and R Ward, *J. Am. Chem. Soc.*, 1955, 77, 6132-6136; and K Isawa et al., *Phys. Rev.*, 1993, B 47, 2849-2853). Such non-stoichiometric materials have, e.g., unit cell parameters of 4.019 Å (x=0.2) and 4.027 Å (x=0.1). As reported by D Ridgley and R Ward, infra, ternary oxide systems of strontium-tantalum, barium-niobium, barium-tantalum have also been evidenced to exhibit similar phases to that of the ternary oxide system of strontium-niobium.

Figure 1:
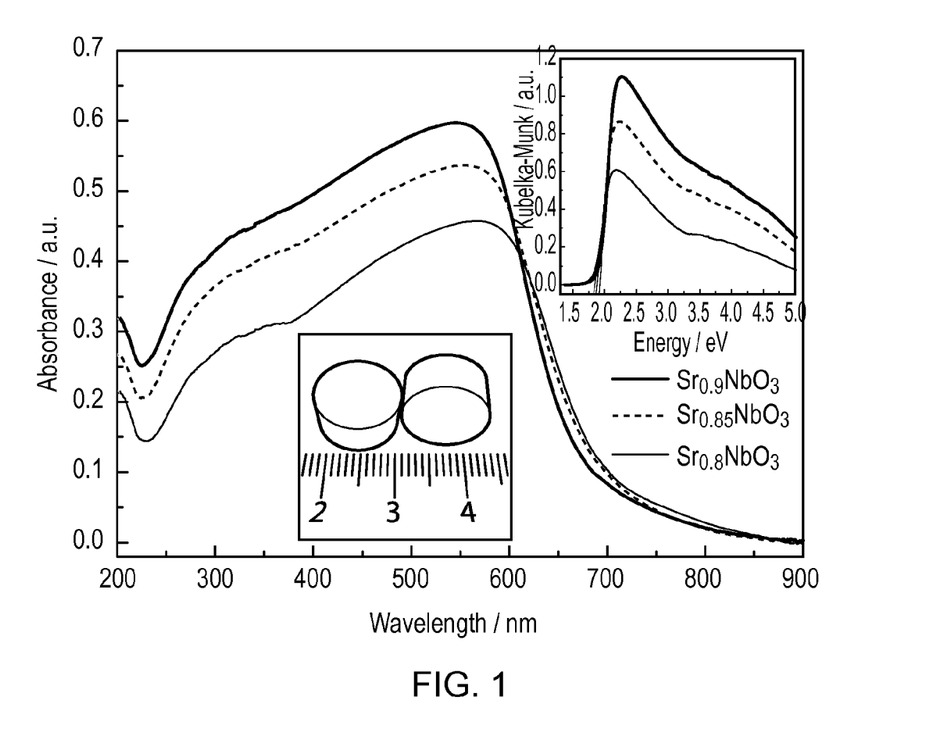
FIG. 1 depicts UV-Vis absorbance spectra (converted from diffuse reflectance spectra) for $Sr_{1-x}NbO_3$ (x=0.1, 0.15 and 0.2) with Kubelka-Munk transformation of absorption curves shown at the top right and typical sintered pellets ($Sr_{0.9}NbO_3$; red) shown in the inserted photograph.

To illustrate the present invention, a series of strongly coloured red materials of formula (I), having bandgaps around 1.9 eV (estimated from an absorption tail to 700 nm), were synthesised in which $0.1 \leq x \leq 0.2$. UV-Vis absorbance spectra (converted from diffuse reflectance spectra) for three of these materials are depicted in FIG. 1 ($Sr_{1-x}NbO_3$ in which x=0.1, 0.15 and 0.2) with Kubelka-Munk transformation of absorption curves shown at the top right showing the band gap energy (eV) associated with the different absorption maximum of the three materials. These materials were single phase according to XRD investigations and electron microscopy examinations. Thermogravimetric analysis showed that the phase was stable against oxidation in air up to 300° C. and confirmed that δ was generally small.

Not only are these materials strongly coloured, they have high electronic conductivity exhibiting conductivity of $3 \times 10^3$ $Scm^{-1}$ for x=0.2. Conductivity decreased slightly on heating to higher temperature from ambient, consistent with previous studies which showed such expected metallic signature with conductivity decreasing with temperature (see N Peng et al., infra, K Isawa et al., infra and B Hessen et al., *Mater. Res. Bul.*, 1991, 26, 85-90). These materials are thus red metallic oxides.

Without wishing to be bound by theory, we believe that the utility of the materials of formulae (I) and (II) as photoactive materials may be attributed to their ability to absorb (visible) light strongly, as evidenced by their red colour, which must create electron hole pairs; their high conductivity implying high carrier (electron) mobility; and that, on the basis of the band calculations on $SrNbO_3$ (I R Shein et al., infra), the created holes are located in oxygen-dominated bands and the electrons in the Nb-dominated conduction band. Given the much lower carrier density of the holes, in an almost fully occupied electron band, it is highly likely that the holes would be much less mobile than the conduction band electrons. It is in consequence of these properties, we believe, that compounds of formula (I) may be used as photoactive material. Moreover, these considerations permit the ready identification of other materials, such as bronzes of formula (II), having similar properties as suitable for use as photoactive material. In other words, use of material formula (I) is not an essential feature of the present invention; the generic concept underlying this invention is the use of a material with metallic properties as a substitute for semiconductor material in a wide variety of applications, for example photocatalytic applications.

According to the first aspect of the invention, a method for effecting a photocatalytic reaction is provided, comprising exposing a mixture of metallic material having an electrical conductivity of about $10^5$ to $10^6$ S/m and a reactant to visible light so as to catalyse a photocatalytic reaction of the reactant.

By visible light is meant herein light having a wavelength of about 400 to about 700 nm. Visible light can be provided by sunlight, or with artificial lighting (e.g. UV-visible lights, optionally fitted with UV cut-off and/or IR cut-off filters.

The reactant for the photocatalytic reaction is not particularly limited: it can, for example, be an organic reactant that may participate in a photocatalytic reaction. Representative photocatalytic reactions include the decolouration of dyes (such as methylene blue), inactivation of bacteria, such as *E. coli*, and photoreduction of carbon dioxide. Organic reactants susceptible to oxidation may in some embodiments of the invention be photooxidised. In this way, the invention may be used in the context of photoremediation, e.g. to remove unwanted organic contaminants (for example found in liquids, e.g. water). In particular embodiments, the contaminants may be polychlorinated biphenyls (PCBs). A particularly significant photocatalytic reaction is the photocatalytic splitting of water allowing the production of oxygen and/or hydrogen from water. Emphasis hereinafter is on this photocatalytic reaction although the invention is not to be understood to be limited to this.

According to particular embodiments of the first aspect of the invention, therefore, the invention provides a method for the photocatalytic splitting of water. This photocatalytic reaction is a well-understood and very intensively investigated reaction, as a way to generate hydrogen from an abundant energy source. For a review see A Kudo and Y Miseki (*Chem. Soc. Rev.*, 2009, 38, 253-278).

Water splitting may be effected by dispersing a suitable powdered photocatalyst in water and exposing the resultant mixture to sunlight. Alternatively, a photocatalyst may be used to form a photoanode in a photoelectrochemical cell, used to effect the oxidation of water to oxygen with photo-generated electrons reducing water to hydrogen on a counter electrode, typically formed from platinum. Such systems are generally referred to as Z-schemes, in which to photosystems together drive a photocatalytic or photochemical conversion, such as (for example) water splitting. Accordingly, the metallic material described herein may be used as one component (typically a photo anode) in a Z-scheme, with the other component being typically (although not necessarily) platinum. The term "Z-scheme" and the use of Z-schemes are well understood to those skilled in the art and are described by Kudo and Miseki (infra) as well as by A Kudo (*MRS Bulletin,* 2011, 36, 32-38) and K Sayama et al. (*J. Photochemistry and Photobiology A: Chemistry,* 2002, 148, 71-77).

Where water splitting is effected by dispersal of a powdered photocatalyst and water, co-catalysts (sometimes referred to as catalyst additives) are typically loaded onto the photocatalyst to introduce active sites for hydrogen revolution, because the energy of the conduction bands of many photocatalysts are not sufficient to allow the reduction of water to hydrogen in the absence of catalysis.

Often, so-called sacrificial reagents are used when effecting water splitting. Use of these can be advantageous to allow address the overpotentials for water splitting hindering the stoichiometric process: the maximum difference in energy between photocreated holes and electrons is around 1.85 eV with the difference in potential between water oxidation and reduction is 1.23 eV at 300K. Where sacrificial reagents are used, the water splitting is not stoichiometric, i.e. the photocatalytic reaction does not yield equimolar quantities of hydrogen and oxygen but instead yields different amounts of hydrogen and oxygen, typically hydrogen or oxygen.

The use of the term sacrificial reagent in the context of water splitting photocatalysis is well understood in the art (see for example A Kudo and Y Miseki, infra). Sacrificial reagents may be used to promote either hydrogen formation or oxygen formation.

Where hydrogen production is desired, a reducing reagent may be used, which is oxidised using the holes generated at the valence band, with water reduced to hydrogen using the electrons at the conductance band. Where oxygen production is desired, an oxidising reagent may be used, which is reduced using the electrons generated at the conductance band, with water oxidised to oxygen using the holes at the valence band.

Where the sacrificial reagent is a reducing reagent, this may be, for example, a metal sulfide, sulfite, halide (e.g. bromide or iodide) (e.g. alkali metal sulfide, sulfite or halide), or a lower alcohol (e.g. a $C_{1-6}$ alcohol such as methanol and ethanol), EDTA or oxalic acid (a common pollutant an industrial wastewater). Where the sacrificial reagent is an oxidising reagent, this may be, for example, be constituted by metal ions such as $Ag^+$ and $Fe^{3+}$, for example as the nitrate salts.

According to particular embodiments of the invention, therefore, there is provided a method for the generation of hydrogen by the photocatalytic splitting of water in the presence of a sacrificial reducing reagent; and a method for the generation of oxygen by the photocatalytic splitting of water in the presence of a sacrificial oxidising reagent.

Typically, the metallic material is used in powdered form, as a suspension in a liquid medium. Where the method of the invention is photocatalytic water splitting, the liquid medium may also be the reactant for the water-splitting reaction, i.e. water. A particular feature of this invention is that no catalyst additives, such as platinum, or nickel or ruthenium oxides, are necessary in order to effect water-splitting.

Figure 3A:
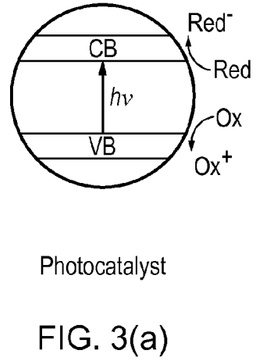
FIG. 3(a) is a scheme showing photocatalytic processes occurring on a single photocatalyst process.
Figure 3B:
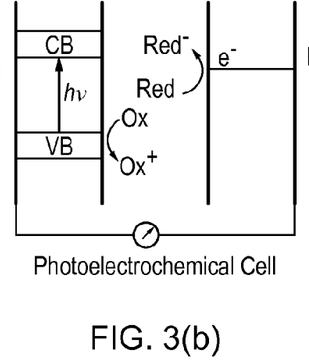
FIG. 3(b) shows a photoelectrochemical process involving the combination of a semiconductor photoelectrode and a metallic counter electrode.
Figure 3C:
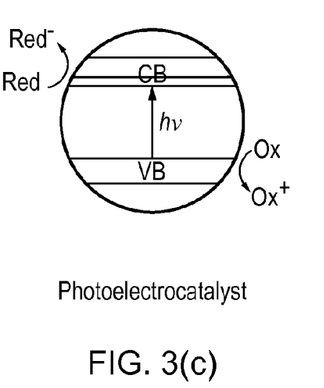
FIG. 3(c) is a phototoelectrocatalytic process occurring at the filled valence band of a metallic oxide particle with the counter process occurring at the metallic conduction band.

It is possible to regard this invention is functioning through photoelectrocatalysis rather than through phototocatalysis. If a semiconductor photocatalyst is considered (see FIG. 3(*a*)) then, once the two photocarriers have been created, the photoreduction and photooxidation processes involve independent redox reactions of the photocarriers. In a photoelectrochemical cell, however, photoelectrons or holes are generated in a semiconductor photoelectrode and the photocarriers drive the primary redox process at the metal counter electrode. The induced potential in the electrochemical circuit then drives the secondary redox process (see FIG. 3(*b*)). With the present invention, depicted schematically in FIG. 3(*c*), it is reasonable to suggest that photogenerated holes in the valence band of the metallic material drive the initial photooxidation process with the induced potential within the particle driving the counter process, i.e. the reduction at the conduction band. For this reason, the method of the invention may be regarded as photoelectrocatalytic.

Whilst the present invention has been described with particular reference to photocatalytic (or photoelectrocatalytic) methods, in particular in which the metallic material described herein is disbursed in a liquid medium comprising or constituting the reactant for the photocatalytic or photoelectrocatalytical reaction, it will be understood that the present invention is applicable ability in other applications reliant upon the photovoltaic effect. For example, photovoltaic devices in which the metallic material described herein may be used include solar cells. Also, an anode of a photoelectrochemical cell (a photoanode) may comprise metallic material having an electrical conductivity of $10^5$ to $10^6$ S/m.

The investigations reported herein indicate that the materials exemplifying the present invention are good photocatalysts for water splitting into hydrogen and oxygen under visible light radiations. The reduction of transition metal cations through the non-stoichiometry defined in formula (I) not only enhances the light-harvesting ability of these materials but also significantly increases their electronic conductivity. This is the first time a metallic material is found to have such photocatalytic activity. The metal-like conductivity (of about 2000 S/cm) is very advantageous in photoelectrochemistry since this allows the use of expensive conductive glasses such as tin oxide as a substrate for semiconductors to be avoided; and permits the use of the materials in photoanodes for use in artificial photosynthesis.

All publications (patent and non-patent) referred to herein are incorporated by reference in their entireties, as if the entire contents of each reference was set forth herein in its entirety.

The invention is now illustrated by the following non-limiting examples.

Synthesis of Strontium Niobates $Sr_{1-x}NbO_3$ (0.1≤x≤0.2)

Strontium niobates $Sr_{1-x}NbO_3$ (0.1≤x≤0.2) were synthesised by calcining homogenized $Sr_4Nb_2O_9$, Nb and $Nb_2O_5$ mixtures in a flowing Ar atmosphere according to the method described by N Peng et al. (infra).

The $Sr_4Nb_2O_9$ precursor was prepared by calcining $SrCO_3$ (Aldrich, ≤99.9%) and $Nb_2O_5$ (Aldrich, 99.9%, −325 mesh) powder mixtures in a molar ratio of 4:1. Ball milling followed by hand grinding were employed for a thorough mixing. The typical calcining temperature was 1200° C. and reaction time was around 48 hours. Intermediate grindings was performed in order to eliminate any secondary phases.

The freshly prepared $Sr_4Nb_2O_9$ powders were then blended with appropriate amount of Nb (Alfa Aesar, 99.8%, −325 mesh) and $Nb_2O_5$ according to the stoichiometry ($Sr_{1-x}NbO_3$, 0.1≤x≤0.2). Hand grindings using a mortar and a pestle were performed for at least 40 minutes to guarantee homogeneous mixing. The admixtures were pressed into pellets under a pressure of 50 MPa using a 13 mm diameter die. The resultant pellets were then wrapped in a molybdenum foil and calcined at 1400° C. for 20 hours in a flowing Ar atmosphere. X-ray powder diffraction confirmed the reddish products crystallised in cubic symmetry and thermogravimetric analysis suggested their oxygen content was close to the stoichiometry. DC electronic conductivities were measured on sintered pellets according to the method of E Konysheva et al. (*J. Mater. Chem.*, 2008, 18, 5147-5154).

TABLE 1

Unit cell parameters, conductivity, colour and band gaps of as-prepared samples

| sample | a (Å) | V (Å$^3$) | Conductivity (S/cm) at 20° C. | colour | Band gap (eV)$^a$ |
|---|---|---|---|---|---|
| $Sr_{0.8}NbO_3$ | 4.01941(6) | 64.936(3) | 3039(1) | purple | 1.84 |
| $Sr_{0.85}NbO_3$ | 4.02383(5) | 65.151(2) | 2693(1) | red | 1.88 |
| $Sr_{0.9}NbO_3$ | 4.02725(7) | 65.317(3) | 2019(1) | red | 1.93 |

Figure 4:
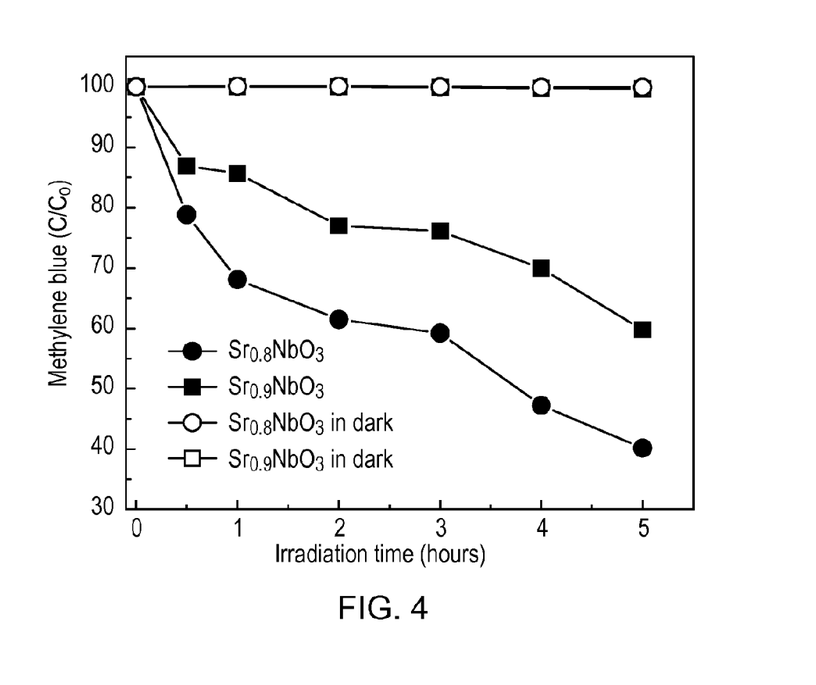
FIG. 4 shows the progress of methylene blue decolourisation reactions against time, using as catalyst $Sr_{0.9}NbO_3$ and $Sr_{0.8}NbO_3$, with and without visible light irradiation.

$^a$determined by extrapolating the onset of Kubelka-Munk curves (see FIG. 1) to the energy axis Photocatalytic Reactions Photocatalytic activity was evaluated by monitoring the degradation of methylene blue (MB) as well as examining the $H_2$ or $O_2$ evolution in various aqueous solutions (oxalic acid or silver nitrate solutions). Visible light irradiations were generated by a 250 W iron-doped metal halide UV-Vis lamp with a UV cut-off filter (λ≥420 nm) (Borosilicate Coated Glass HM07, UQG (optic) Ltd., Cambridge UK). For MB degradation, 0.1 g sample powders were suspended in 200 ml of MB aqueous solution ($1\times10^{-4}$ M) under air bubbling. The suspension (0.5 g/L) was first concealed in a dark condition for 2 hours to reach absorption equilibrium before irradiations. The photoactivity of samples was then evaluated by monitoring the intensity of the strongest absorption peak of MB at 665 nm on a Perkin Elmer Lambda 35 UV/vis spectrometer along with irradiation time. 2 ml aliquots were sampled at various time intervals and the initial pH value was kept at 7.0. The temperature during irradiations was controlled at about 25° C. by using a water bath for the removal of infrared radiation and heat. The resultant data, showing the progress of decolourisation against time, is plotted in FIG. 4.

Figure 2A:
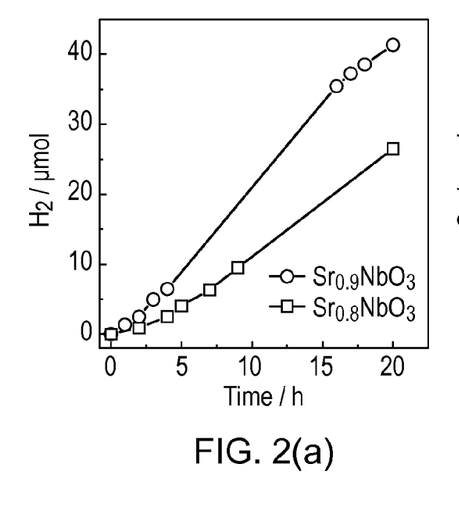
FIG. 2(a) and FIG. 2(b) are plots of photocatalytic performance of as-prepared strontium niobates under visible light irradiations, with FIG. 2(a) showing typical time courses of $H_2$ evolution in aqueous oxalic acid solution (0.025 M)
Figure 2B:
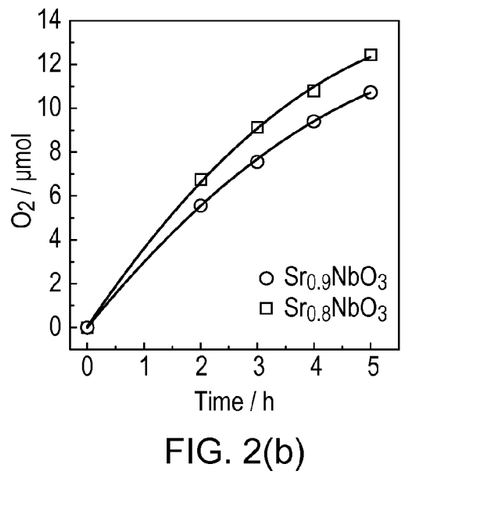

For $H_2$ or $O_2$ evolution, 0.1 g or 0.2 g sample powders were suspended in 200 ml oxalic acid aqueous solution (0.025 M) or 200 ml silver nitrate solution (0.005 M) under visible light irradiations. The suspensions were sealed in a home-made photoreactor purged with pure Ar as a protective gas. The evolved gases under irradiations were then examined using an online gas chromatograph (Agilent 3000 Micro Gas Chromatograph). The resultant data, showing evolution of hydrogen and oxygen gas against time, is plotted in FIG. 2.

We have thus shown these red metallic oxides to be photocatalytically active utilising visible light for both oxidative and reductive water splitting processes. In both cases sacrificial elements were used to facilitate the reverse processes; however, no catalyst additives such as Pt (A Kudo and Y Miseki, infra), were utilised to promote either oxidation or reverse process. Materials of formula (I) have also been found to be active for the oxidative decolourisation of the dye methylene blue.

Figure 5:
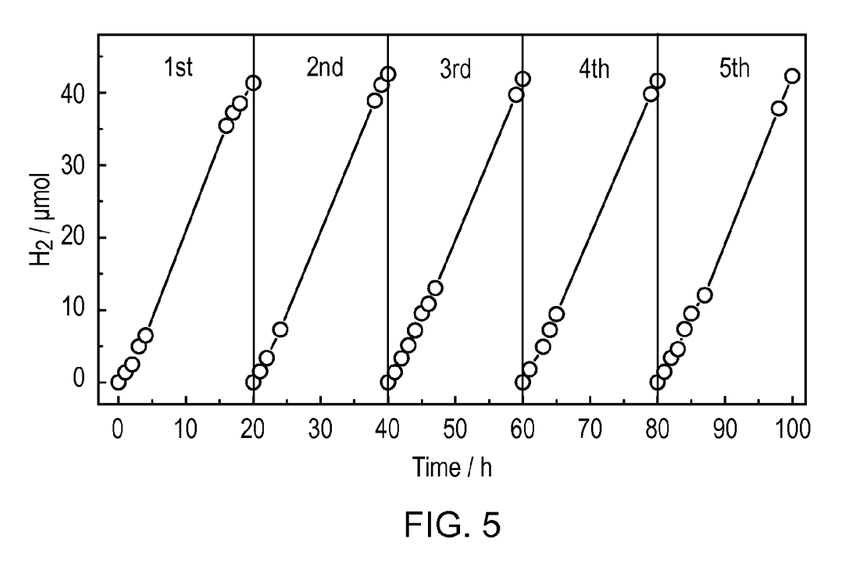
FIG. 5 shows typical repeating time courses of hydrogen evolution with use of $Sr_{0.9}NbO_3$ under visible light irradiations. Pure argon was purged into the reactor at the end of each experiment (20 hours irradiations).

Since the effective oxidation state of Nb in strontium niobate is close to 4, it is possible this could be reducing water chemically. However, this was not found to be a significant process under investigated conditions. No hydrogen was detected under identical experimental conditions, which maintained the presence of sacrificial oxalate, and in which the light source was masked. Activity was also maintained over five photoreduction cycles of 20 hours each with no detectable change in the colouration and oxidation state of catalyst (see FIG. 5). The ability of non-stoichiometric strontium niobate to act as an oxidative photocatalyst conclusively proves that this metallic conductor can be utilised as a photocatalyst.

The best mode for carrying out the invention has been described for purposes of illustrating the best mode known to the applicant at the time. The examples are illustrative only and not meant to limit the invention, as measured by the scope and merit of the claims. The invention has been described with reference to preferred and alternate embodiments. Obviously, modifications and alterations will occur to others upon the reading and understanding of the specification. It is intended to include all such modifications and alterations insofar as they come within the scope of the appended claims or the equivalents thereof.

The invention claimed is:

1. A method for effecting a photocatalytic or photoelectrocatalytic reaction of a reactant comprising: contacting a metallic oxide material having an electrical conductivity of $10^5$ to $10^6$ S/m with the reactant; and exposing the metallic oxide material and the reactant to visible light so as to catalyse the reaction of the reactant, wherein the metallic oxide material comprises material having the formula (I): $A_{(1-x)}BO_{(3-\delta)}$, wherein: 0<x<0.25; A is at least one of Sr, Ba, Ca and Cd, and combinations thereof; B is at least one of Nb, V, Ta, Ti, Cr, Mo and W and combinations thereof; δ is dependent upon the value of x and is 0 or a positive number of less than 1.

2. The method of claim 1 wherein 0.1≤x≤0.2.

3. The method of claim 1 wherein
A is selected from the group consisting of strontium and barium.

4. The method of claim 1 wherein
A is strontium.

5. The method of claim 1 wherein
B is niobium.

6. The method of claim 1, wherein
the reactant is water or an organic reactant.

7. The method of claim 6, wherein
the method is a method for the photocatalytic splitting of water, photoreduction of carbon dioxide and/or photo-oxidation of organic contaminants.

8. The method of claim 6, wherein the method is a method for the photocatalytic splitting of water.

9. The method of claim 8 wherein
the method comprises dispersing the metallic oxide material in water in the presence of a sacrificial reagent and exposing the resultant mixture to sunlight.

10. The method of claim 9, wherein the sacrificial reagent is a reducing sacrificial reagent and the method serves to produce hydrogen.

11. The method of claim 9, wherein the sacrificial reagent is an oxidising sacrificial reagent and the method serves to produce oxygen.

12. The method of claim 1, wherein the metallic oxide material is a photocatalyst in a Z-scheme.

13. A photovoltaic device comprising:
a photoactive material in which the photoactive material is a metallic oxide material having an electrical conductivity of $10^5$ to $10^6$ S/m,
wherein the metallic oxide material comprises material having the formula (I):

$$A_{1-x}BO_{3-\delta} \qquad (I),$$

wherein:
  $0<x<0.25$;
  A is at least one of Sr, Ba, Ca and Cd, and combinations thereof;
  B is at least one of Nb, V, Ta, Ti, Cr, Mo and W and combinations thereof;
  $\delta$ is dependent upon the value of x and is 0 or a positive number of less than 1.

14. The device of claim 13 wherein
the device is a photovoltaic cell or a photoanode of a photoelectrochemical cell.

15. A method for effecting a photocatalytic or photoelectrocatalytic reaction of a reactant comprising:
contacting a non-stoichiometric metallic oxide material having an electrical conductivity of $10^5$ to $10^6$ S/m with the reactant; and
exposing the non-stoichiometric metallic oxide material and the reactant to visible light so as to catalyse the reaction of the reactant, wherein the metallic oxide material comprises material having the formula (I):

$$A_{1-x}BO_{3-\delta} \qquad (I),$$

wherein:
  $0<x<0.25$;
  A is at least one of Sr, Ba, Ca and Cd, and combinations thereof;
  B is at least one of Nb, V, Ta, Ti, Cr, Mo and W and combinations thereof;
  $\delta$ is dependent upon the value of x and is 0 or a positive number of less than 1.

16. A photovoltaic device comprising:
a photoactive material in which the photoactive material is a non-stoichiometric metallic oxide material having an electrical conductivity of $10^5$ to $10^6$ S/m,
wherein the non-stoichiometric metallic oxide material comprises material having the formula (I):

$$A_{1-x}BO_{3-\delta} \qquad (I),$$

wherein:
  $0<x<0.25$;
  A is at least one of Sr, Ba, Ca and Cd, and combinations thereof;
  B is at least one of Nb, V, Ta, Ti, Cr, Mo and W and combinations thereof;
  $\delta$ is dependent upon the value of x and is 0 or a positive number of less than 1.

* * * * *